(12) United States Patent
Ahn

(10) Patent No.: US 10,147,871 B2
(45) Date of Patent: Dec. 4, 2018

(54) MAGNETIC MEMORY DEVICES

(71) Applicant: Sungmin Ahn, Hwaseong-si (KR)

(72) Inventor: Sungmin Ahn, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/473,747

(22) Filed: Mar. 30, 2017

(65) Prior Publication Data

US 2018/0062070 A1 Mar. 1, 2018

(30) Foreign Application Priority Data

Aug. 31, 2016 (KR) .................. 10-2016-0111951

(51) Int. Cl.
| | |
|---|---|
| *H01L 43/02* | (2006.01) |
| *H01L 27/22* | (2006.01) |
| *H01L 43/08* | (2006.01) |
| *H01L 43/10* | (2006.01) |

(52) U.S. Cl.
CPC ............ *H01L 43/02* (2013.01); *H01L 27/222* (2013.01); *H01L 43/08* (2013.01); *H01L 43/10* (2013.01)

(58) Field of Classification Search
CPC .......... H01L 43/02; H01L 43/08; H01L 27/22
See application file for complete search history.

(56) References Cited

U.S. PATENT DOCUMENTS

| | | |
|---|---|---|
| 6,759,120 B2 | 7/2004 | Jongill et al. |
| 7,432,574 B2 | 10/2008 | Nakamura et al. |
| 7,450,351 B2 | 11/2008 | Oshima et al. |
| 7,612,969 B2 | 11/2009 | Oh et al. |
| 7,808,747 B2 | 10/2010 | Fuji et al. |
| 8,184,408 B2 | 5/2012 | Murakami et al. |
| 8,685,491 B2 | 4/2014 | Takeo et al. |
| 8,778,515 B2 | 7/2014 | Sato et al. |
| 8,779,537 B2 | 7/2014 | Huai et al. |
| 8,889,274 B2 | 11/2014 | Yoon et al. |

(Continued)

FOREIGN PATENT DOCUMENTS

| | | |
|---|---|---|
| JP | 2005158092 A | 6/2005 |
| JP | 2006196613 A | 7/2006 |
| JP | 2013187305 A | 9/2013 |

*Primary Examiner* — Tran Tran
(74) *Attorney, Agent, or Firm* — Harness, Dickey & Pierce, P.L.C.

(57) ABSTRACT

A magnetic memory device may include a magnetic tunnel junction pattern that comprises a tunnel barrier pattern, a first magnetic pattern and a second magnetic pattern, a tunnel barrier pattern between the first and second magnetic patterns, a non-magnetic pattern on the second magnetic pattern, and a magnetic material between at least a distal portion of the non-magnetic pattern and the second magnetic pattern. The magnetic material may include a set of fine magnetic patterns between the second magnetic pattern and the non-magnetic pattern, the set of fine magnetic patterns including a pattern of fine magnetic patterns spaced apart from each other in a direction parallel to an interface between the second magnetic pattern and the non-magnetic pattern. The magnetic material may include magnetic atoms, and the non-magnetic material may include a proximate portion that is proximate to the second magnetic pattern, the proximate portion doped with the magnetic atoms.

20 Claims, 12 Drawing Sheets

(56) References Cited

U.S. PATENT DOCUMENTS

| | | |
|---|---|---|
| 9,028,909 B2 | 5/2015 | Fukuzawa et al. |
| 9,177,574 B2 | 11/2015 | Fuji et al. |
| 9,337,415 B1 | 5/2016 | Oh et al. |
| 2008/0239590 A1* | 10/2008 | Fuke .................. B82Y 10/00 360/324.12 |
| 2009/0197119 A1 | 8/2009 | Kong et al. |
| 2011/0261478 A1 | 10/2011 | Takeo et al. |
| 2014/0264663 A1 | 9/2014 | Chen et al. |
| 2014/0272473 A1 | 9/2014 | Chen et al. |
| 2015/0325260 A1 | 11/2015 | Singleton et al. |

* cited by examiner

MAGNETIC MEMORY DEVICES

CROSS-REFERENCE TO RELATED APPLICATIONS

This U.S. nonprovisional patent application claims priority under 35 U.S.C. § 119 of Korean Patent Application 10-2016-0111951 filed on Aug. 31, 2016, the entire contents of which are hereby incorporated by reference.

BACKGROUND

The present inventive concepts relate to magnetic memory devices and, more particularly, to magnetic memory devices that include a magnetic tunnel junction.

As electronic devices trend toward high speed and/or low power consumption, high speed and low operating voltages are increasingly desired for semiconductor memory devices incorporated in the electronic devices. In order to meet the above requirement, magnetic memory devices have been suggested as semiconductor memory devices. Since magnetic memory devices may operate at high speed and have nonvolatile characteristics, they have attracted considerable attention as the next generation of semiconductor memory devices.

A magnetic memory device may generally include a magnetic tunnel junction (MTJ) pattern. A magnetic tunnel junction pattern may include two magnetic structures and an insulation layer interposed therebetween. The resistance of a magnetic tunnel junction pattern may vary depending on magnetization directions of the two magnetic structures. For example, the magnetic tunnel junction pattern may have high resistance when the magnetization directions of the two magnetic structures are anti-parallel and low resistance when the magnetization directions of the two magnetic structures are parallel. The magnetic memory device may write/read data using the resistance difference between the high and low resistances of the magnetic tunnel junction pattern.

With the remarkable advances in electronic industry, there is an increasing demand for magnetic memory devices having high integration and/or low power consumption. Accordingly, many studies have been conducted to meet these demands.

SUMMARY

Some example embodiments of the present inventive concepts provide a magnetic memory device having an improved interface perpendicular magnetic anisotropy between magnetic and non-magnetic layers of a magnetic tunnel junction structure.

Some example embodiments of the present inventive concepts provide a magnetic memory device having enhanced thermal stability and tunnel magnetic resistance of a magnetic tunnel junction structure.

According to some example embodiments of the present inventive concepts, a magnetic memory device may include a substrate and a plurality of magnetic tunnel junction patterns on the substrate. Each magnetic tunnel junction pattern of the plurality of magnetic tunnel junction patterns may include: a first magnetic pattern and a second magnetic pattern stacked in a direction perpendicular to a top surface of the substrate; a tunnel barrier pattern between the first magnetic pattern and the second magnetic pattern; a non-magnetic pattern on the second magnetic pattern in the direction perpendicular to the top surface of the substrate, such that the second magnetic pattern is between the non-magnetic pattern and the tunnel barrier pattern; and a set of fine magnetic patterns between the second magnetic pattern and the non-magnetic pattern. The set of fine magnetic patterns may include a pattern of fine magnetic patterns spaced apart from each other in a direction parallel to the top surface of the substrate.

According to some example embodiments of the present inventive concepts, a magnetic memory device may include: a substrate and a plurality of magnetic tunnel junction patterns on the substrate. Each magnetic tunnel junction pattern of the plurality of magnetic tunnel junction patterns may include: a first magnetic pattern and a second magnetic pattern stacked in a direction perpendicular to a top surface of the substrate; a tunnel barrier pattern between the first magnetic pattern and the second magnetic pattern; and a non-magnetic pattern on the second magnetic pattern in the direction perpendicular to the top surface of the substrate, such that the second magnetic pattern is between the non-magnetic pattern and the tunnel barrier pattern, at least a portion of the non-magnetic pattern doped with magnetic atoms.

According to some example embodiments, a magnetic tunnel junction pattern may include a first magnetic pattern, a second magnetic pattern on the first magnetic pattern, a tunnel barrier pattern between the first magnetic pattern and the second magnetic pattern, a non-magnetic pattern on the second magnetic pattern, and a magnetic material between at least a distal portion of the non-magnetic pattern and the second magnetic pattern.

The present inventive concepts, however, are not limited to the embodiments mentioned described herein.

DETAILED DESCRIPTION OF EMBODIMENTS

Figure 1:
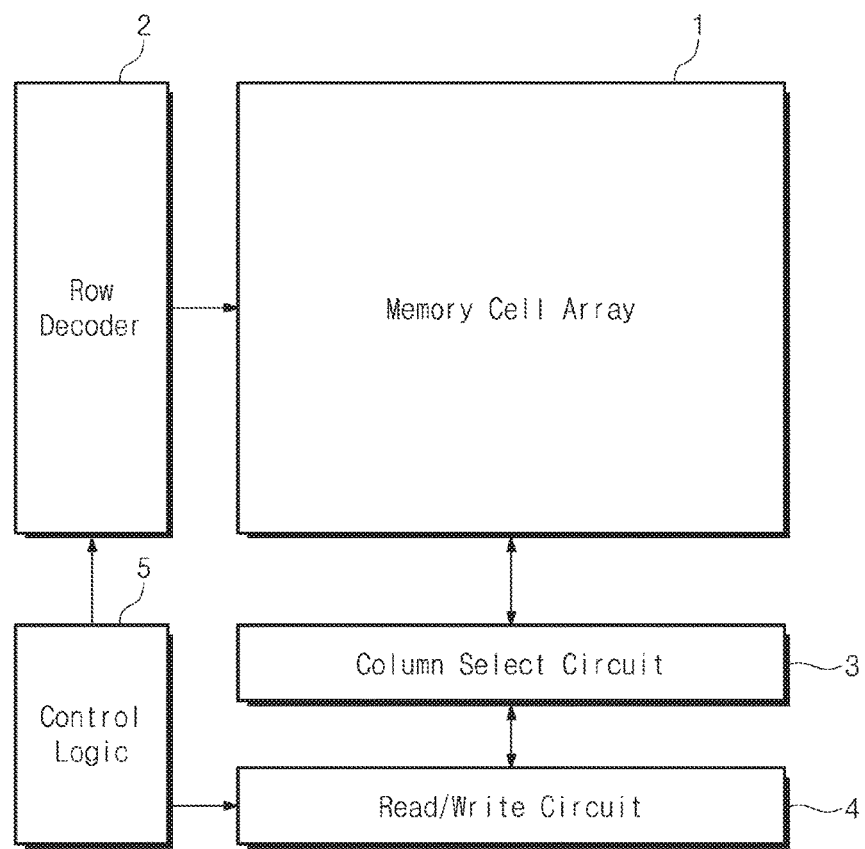
FIG. 1 is a block diagram illustrating a magnetic memory device according to some example embodiments of the present inventive concepts.

FIG. 1 is a block diagram illustrating a magnetic memory device according to some example embodiments of the present inventive concepts.

Referring to FIG. 1, a magnetic memory device may include a memory cell array 1, a row decoder 2, a column select circuit 3, a read/write circuit 4, and a control logic 5. The magnetic memory device shown in FIG. 1 may be included in one or more electronic devices.

The memory cell array 1 may include a plurality of word lines and a plurality of bit lines, and memory cells may be connected to intersections where the word lines and the bit lines cross each other. The memory cell array 1 will be further discussed in detail below with reference to FIG. 2.

The row decoder 2 may be connected to the memory cell array 1 through the word lines. The row decoder 2 may decode an address input from external to select one of the word lines.

The column select circuit 3 may be connected to the memory cell array 1 through the bit lines, and may decode an address input from external to select one of the bit lines. The bit line selected by the column select circuit 3 may be connected to the read/write circuit 4.

The read/write circuit 4 may provide a bit line bias for accessing a selected memory cell under the control of the control logic 5. The read/write circuit 4 may provide the selected bit line with a bit line voltage to write input data to or read input data from the memory cell.

The control logic 5 may output control signals to control a semiconductor memory device in response to a command signal provided from external. The read/write circuit 4 may be controlled by the output control signals from the control logic 5. In some example embodiments, the control logic 5 may include a processor (e.g., processing circuitry). For example, the control logic 5 may include a central processing unit (CPU).

Figure 2:
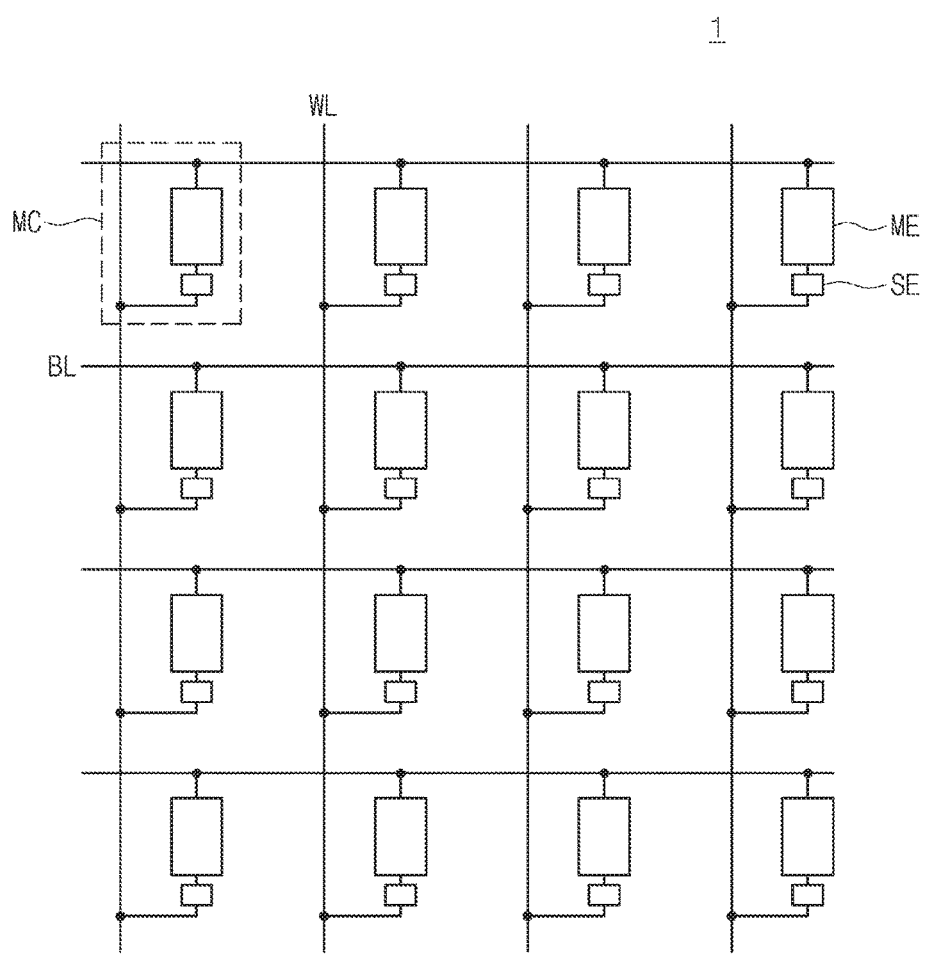
FIG. 2 is a circuit diagram illustrating a memory cell array of a magnetic memory device according to some example embodiments of the present inventive concepts.
Figure 3:
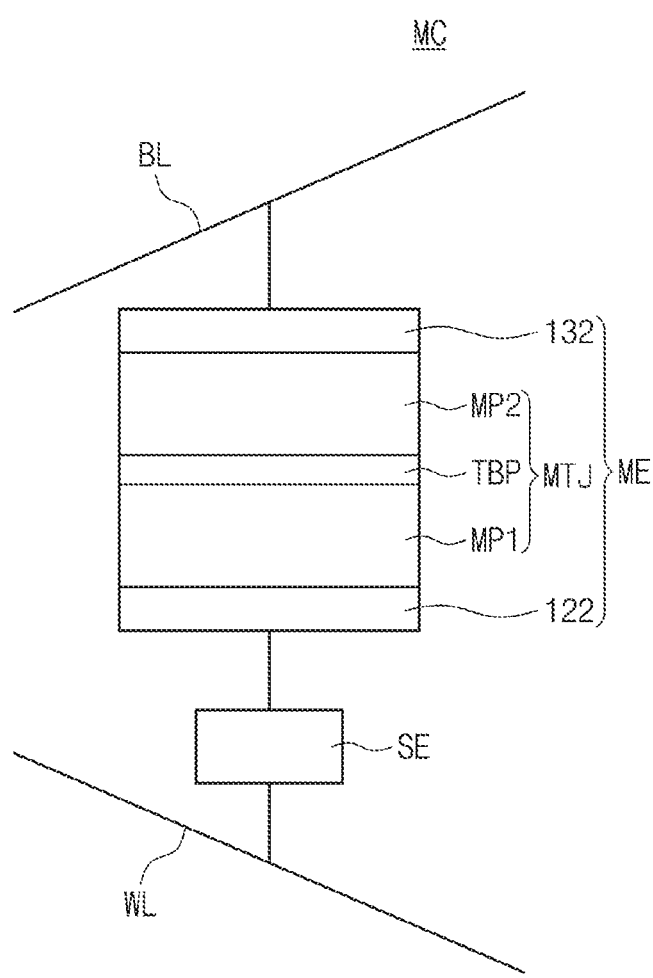
FIG. 3 is a circuit diagram illustrating a unit memory cell of a magnetic memory device according to some example embodiments of the present inventive concepts.

FIG. 2 is a circuit diagram illustrating a memory cell array of a magnetic memory device according to some example embodiments of the present inventive concepts. FIG. 3 is a circuit diagram illustrating a unit memory cell of a magnetic memory device according to some example embodiments of the present inventive concepts.

Referring to FIG. 2, the memory cell array 1 may include a plurality of first conductive lines, a plurality of second conductive lines, and a plurality of unit memory cells MC. The first conductive lines may be word lines WL, and the second conductive lines may be bit lines BL. The unit memory cells MC may be two- or three-dimensionally arranged. The unit memory cells MC may be connected between the word lines WL and the bit lines BL crossing each other. Each of the word lines WL may connect the plurality of unit memory cells MC to each other. Each of the bit lines BL may be connected to each of the unit memory cells MC that are coupled to one word line WL. Therefore, each of the bit lines BL may connect each of the unit memory cells MC coupled to one word line WL to the read/write circuit 4 discussed with reference to FIG. 1.

Referring to FIG. 3, each of the unit memory cells MC may include a memory element ME and a select element SE. The memory element ME may be connected between the bit line BL and the select element SE, and the select element SE may be connected between the memory element ME and the word line WL. The memory element ME may be a variable resistance device that is switched from one to the other of its two resistance states by an applied electrical pulse.

In some example embodiments, the memory element ME may have a thin film whose electrical resistance can be changed using a spin transferring phenomenon of an electrical current flowing through the memory element ME. The memory element ME may include a thin film structure configured to exhibit a magneto-resistance property, and include at least one ferromagnetic material and/or at least one anti-ferromagnetic material.

The select element SE may be configured to selectively control a charge flow passing across the memory element ME. For example, the select element SE may be one of a diode, a PNP bipolar transistor, an NPN bipolar transistor, an NMOS field effect transistor, and a PMOS field effect transistor. If the select element SE is composed of a three-terminal device such as a bipolar transistor or a MOS field effect transistor, an additional interconnection line (not shown) may be connected to the select element SE.

In detail, the memory element ME may include a first magnetic pattern MP1, a second magnetic pattern MP2, and a tunnel barrier pattern TBP therebetween. The first magnetic pattern MP1, the second magnetic pattern MP2, and the tunnel barrier pattern TBP may be combined to define a magnetic tunnel junction MTJ. Each of the first and second magnetic patterns MP1 and MP2 may include at least one magnetic layer, which is formed of a magnetic material. The memory element ME may include a first electrode pattern 122, which is interposed between the first magnetic pattern MP1 and the select element SE, and a second electrode pattern 132, which is interposed between the second magnetic pattern MP2 and the bit line BL.

Figure 4:
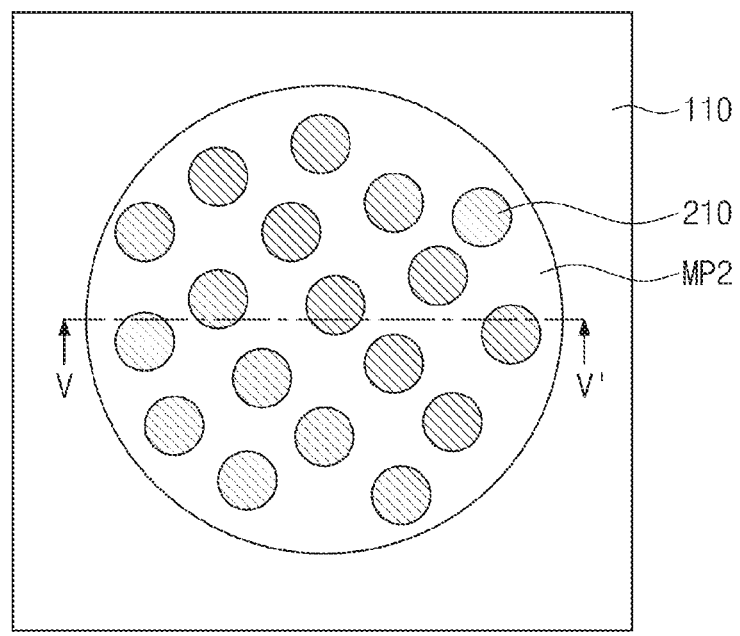
FIG. 4 is a plan view illustrating a magnetic tunnel junction structure according to some example embodiments of the present inventive concepts.
Figure 5:
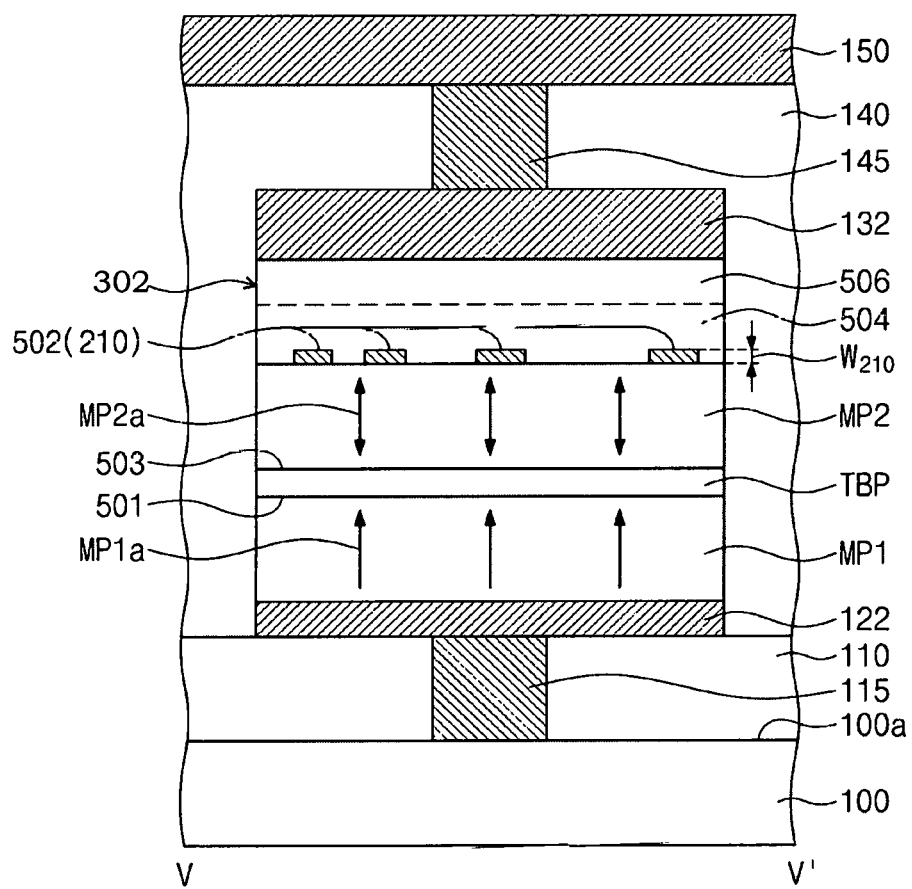
FIG. 5 is a cross-sectional view taken along line V-V' of FIG. 4.

FIG. 4 is a plan view illustrating a magnetic tunnel junction structure according to some example embodiments of the present inventive concepts. Magnetic patterns are not provided thereon with some components, which are discussed below, for clarity of the description. FIG. 5 is a cross-sectional view taken along line V-V' of FIG. 4.

Referring to FIGS. 4 and 5, a substrate 100 may include a semiconductor substrate. For example, the substrate 100 may include a silicon substrate, a germanium substrate, or a silicon-germanium substrate. A select element (not shown) may be provided on the substrate 100. In another example, the select element may be one of a diode, a PNP bipolar transistor, an NPN bipolar transistor, an NMOS field effect transistor, and a PMOS field effect transistor.

A first interlayer dielectric layer 110 may be provided on the substrate 100. The first interlayer dielectric layer 110 may include an insulative material. For example, the first interlayer dielectric layer 110 may include silicon oxide, silicon nitride, silicon oxynitride, or any combination thereof.

A first contact plug 115 may be provided on the substrate 100 and may extend ("penetrate") through the first interlayer dielectric layer 110. For example, the first contact plug 115 may penetrate the first interlayer dielectric layer 110 in a direction perpendicular or substantially perpendicular (e.g., perpendicular within manufacturing tolerances and/or material tolerances) to a top surface 100a of the substrate 100. The first contact plug 115 may be electrically connected to the select element. The first contact plug 115 may include a conductive material. For example, the first contact plug 115 may include doped semiconductor material (e.g., doped silicon), metal (e.g., tungsten, aluminum, copper, titanium, and/or tantalum), conductive metal nitride (e.g., titanium nitride, tantalum nitride, and/or tungsten nitride), metal-semiconductor compound (e.g., metal silicide), or any combination thereof.

A first electrode pattern 122 may be provided on the first interlayer dielectric layer 110 and the first contact plug 115. The first contact plug 115 may electrically connect the first electrode pattern 122 to the select element. The first electrode pattern 122 may include conductive metal nitride, metal, or a combination thereof. In some example embodiments, the first electrode pattern 122 may include at least one seed layer that is configured to serve as a seed in a process for forming a first magnetic pattern MP1 which will be discussed below. For example, if and/or when the first magnetic pattern MP1 is formed of (e.g., may at least partially comprise) a magnetic material having an $L1_0$ structure, the first electrode pattern 122 may be formed of (e.g., may at least partially comprise) conductive metal nitride having a sodium chloride (NaCl) crystal structure (e.g., titanium nitride, tantalum nitride, chromium nitride, or vanadium nitride). In some example embodiments, if and/or when the first magnetic pattern MP1 has a hexagonal close-packed crystal structure, the first electrode pattern 122 may be formed of (e.g., may at least partially comprise) a conductive material having a hexagonal close-packed crystal structure (e.g., ruthenium). However, the material included in the first electrode pattern 122 is not limited to those disclosed above. The first electrode pattern 122 may be formed of (e.g., may at least partially comprise) other conductive materials (e.g., titanium or tantalum).

The first electrode pattern 122 may be sequentially provided thereon (e.g., on the first interlayer dielectric layer 110 and the first contact plug 115) with a first magnetic pattern MP1, a tunnel barrier pattern TBP, and a second magnetic pattern MP2 provided on the first electrode pattern 122. The first magnetic pattern MP1, second magnetic pattern MP2, and tunnel barrier pattern TBP may be stacked in a direction that is perpendicular or substantially perpendicular to a top surface 100a of the substrate 100. A magnetic tunnel junction (MTJ) structure on the first electrode pattern 122 may be defined by (e.g., may include) a structure including at least the first magnetic pattern MP1, the tunnel barrier pattern TBP, and the second magnetic pattern MP2. In some example embodiments, if and/or when the magnetic tunnel junction structure is in a write operation, the first magnetic pattern MP1 may be a reference magnetic pattern having a fixed magnetization direction MP1a and the second magnetic pattern MP2 may be a free magnetic pattern having a changeable magnetization direction MP2a. However, the first and second magnetic patterns MP1 and MP2 are not limited to those disclosed above. For example, in some example embodiments, the first magnetic pattern MP1 may be a free magnetic pattern and the second magnetic pattern MP2 may be a reference magnetic pattern. For brevity of the description, some example embodiments where the first magnetic pattern MP1 is a reference magnetic pattern and the second magnetic pattern MP2 is a free magnetic pattern will be hereinafter described, but it will be understood that the example embodiments are not limited thereto.

As described herein, where an element is referred to as being "on," or "adjacent to," another element, the element may be directly on, or directly adjacent to, the other element, or one or more other intervening elements may be present. In contrast, when an element is referred to as being "directly on," or "immediately adjacent to," another element there are no intervening elements present.

It will be further understood that an element that is referred to as being "on" another element may be above or below the other element.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

The first magnetic pattern MP1 may have (e.g., may be associated with) a magnetization direction MP1a that is perpendicular to an interface 501 between the tunnel barrier pattern TBP and the first magnetic pattern MP1. In some example embodiments, the first magnetic pattern MP1 may include at least one of a perpendicular magnetic material, a perpendicular magnetic material having an $L1_0$ structure, a CoPt alloy of a hexagonal close-packed lattice structure, and a perpendicular magnetic structure. For example, the perpendicular magnetic material may include CoFeTb, CoFeGd, CoFeDy, or any combination thereof. In another example, the perpendicular magnetic material having an $L1_0$ structure may include at least one of FePt of an $L1_0$ structure, FePd of an $L1_0$ structure, CoPd of an $L1_0$ structure, and CoPt of an $L1_0$ structure. The perpendicular magnetic structure may include magnetic patterns and non-magnetic patterns that are alternately and repeatedly stacked (e.g., the perpendicular magnetic structure may include an alternating stack of magnetic patterns and non-magnetic patterns). For example, the perpendicular magnetic structure may include at least one of a (Co/Pt)n stack structure, a (CoFe/Pt)n stack structure, a (CoFe/Pd)n stack structure, a (Co/Pd)n stack structure, a (Co/N)n stack structure, a (Co/Ni)n stack structure, a (CoNi/Pt)n stack structure, a (CoCr/Pt)n stack structure, a (CoCr/Pd)n stack structure (where, n is a natural number), and any combination thereof.

In some example embodiments, the tunnel barrier pattern TBP may include at least one of magnesium oxide, titanium oxide, aluminum oxide, magnesium-zinc oxide, magnesium-boron oxide, and any combination thereof. In some example embodiments, the tunnel barrier pattern TBP may include magnesium oxide having a sodium chloride (NaCl) crystal structure.

In some example embodiments, the second magnetic pattern MP2 may have a magnetization direction MP2a perpendicular to an interface 503 between the tunnel barrier pattern TBP and the second magnetic pattern MP2. In some example embodiments, the second magnetic pattern MP2 may include a magnetic element that is configured to combine with oxygen to induce interface perpendicular magnetic anisotropy (i-PMA). In some example embodiments, the second magnetic pattern MP2 may further include boron (B). The second magnetic pattern MP2 may include cobalt-iron-boron (CoFeB). In some example embodiments, the second magnetic pattern MP2 may be in an amorphous state during its deposition. The second magnetic pattern MP2 may include cobalt-iron-boron (CoFeB) having an amorphous state during its deposition.

In some example embodiments a magnetic tunnel junction pattern includes at least one instance of magnetic material between at least a distal portion of a non-magnetic pattern 302 and the second magnetic pattern MP2. In some example embodiments, and as described further below, the magnetic material may include a set 502 of fine magnetic patterns 210 between the non-magnetic pattern 302 and the second magnetic pattern MP2. In some example embodiments, and as described further below, the magnetic material may include magnetic atoms 220 included in a proximate portion 801 of the non-magnetic pattern 302.

A set 502 of fine magnetic patterns 210 may include one or more fine magnetic patterns 210 and may be provided on the second magnetic pattern MP2. The fine magnetic patterns 210 are exaggeratedly illustrated for convenience of the description. The fine magnetic patterns 210 may each include a magnetic material. The set 502 of fine magnetic patterns 210 will be understood to include a particular configuration (e.g., arrangement) of the fine magnetic patterns 210. The fine magnetic patterns 210 included in a set 502 may be horizontally spaced apart from each other, such that the set 502 is understood to include a horizontally-spaced configuration of fine magnetic patterns. For example, the fine magnetic patterns 210 in a set 502 may be spaced apart from each other in a direction parallel to the top surface 100a of the substrate 100. Each of the fine magnetic patterns 210 may have a thickness W210 in a direction perpendicular or substantially perpendicular to the top surface 100a of the substrate 100. The thickness W210 of each of the fine magnetic patterns 210 may be less than 2 monolayers (or a bilayer) of atoms of the magnetic material included in the fine magnetic patterns 210 or than a lattice constant of the magnetic material included in the fine magnetic patterns 210. The fine magnetic patterns 210 may have a magnetic moment perpendicular or substantially perpendicular to the top surface 100a of the substrate 100. The magnetic moment of the fine magnetic patterns 210 may reinforce a magnetic moment of an area between the second magnetic pattern MP2 and a non-magnetic pattern 302 which is discussed below, such that the set 502 of fine magnetic patterns 210 are understood to be configured to reinforce a magnetic moment of an area between the second magnetic pattern MP2 and a non-magnetic pattern 302. The set 502 of fine magnetic patterns 210 may thus be configured to reinforce magnetic polarization and interface perpendicular magnetic anisotropy (iPMA) between the second magnetic pattern MP2 and the non-magnetic pattern 302. The set 502 of fine magnetic patterns 210 may further be configured to increase thermal stability and tunnel magnetic resistance of the magnetic tunnel junction (MTJ) structure.

A non-magnetic pattern 302 may be provided on the second magnetic pattern MP2 and the fine magnetic patterns 210. The non-magnetic pattern 302 may cover at least a portion of the second magnetic pattern MP2 and the set 502 of fine magnetic patterns 210. For example, a proximate portion 504 of the non-magnetic pattern 302 may be on the fine magnetic patterns 210 and the portion of the second magnetic pattern MP2, such that the proximate portion 504 covers the fine magnetic patterns 210 and the portion of the second magnetic pattern MP2 that is exposed by the fine magnetic patterns 210. A distal portion 506 of the non-magnetic pattern 302 may be isolated from the fine magnetic patterns 210 by the proximate portion. The non-magnetic pattern 302 may adjoin the second magnetic pattern MP2 and the set 502 of fine magnetic patterns 210. The non-magnetic pattern 302 may at least partially fill spaces between (e.g., may be between) at least two adjacent fine magnetic patterns 210. The non-magnetic pattern 302 may include a non-magnetic material. For example, the non-magnetic pattern 302 may include tantalum oxide, titanium oxide, magnesium oxide, hafnium oxide, zirconium oxide, tungsten oxide, molybdenum oxide, or any combination thereof.

A second electrode pattern 132 may be provided on the non-magnetic pattern 302. The second electrode pattern 132 may include metal (e.g., tungsten, aluminum, copper, titanium, ruthenium, and/or tantalum), conductive metal nitride (e.g., titanium nitride, tantalum nitride, and/or tungsten nitride), or any combination thereof.

A second interlayer dielectric layer 140 may be provided to cover sidewalls of the first electrode pattern 122, the first magnetic pattern MP1, the tunnel barrier pattern TBP, the second magnetic pattern MP2, the non-magnetic pattern 302, and the second electrode pattern 132, and further cover at least a portion of a top surface of the second electrode pattern 132. The second interlayer dielectric layer 140 may include, for example, a silicon oxide layer, a silicon nitride layer, a silicon oxynitride layer, or any combination thereof.

A second contact plug 145 may be provided on the second electrode pattern 132 and may extend ("penetrate") through the second interlayer dielectric layer 140. The second contact plug 145 may be electrically connected to the second electrode pattern 132. An interconnect line 150 may be provided on the second interlayer dielectric layer 140. The interconnect line 150 may be electrically connected to the second contact plug 145. Each of the second contact plug 145 and the interconnect line 150 may include doped semiconductor material (e.g., doped silicon), metal (e.g., tungsten, aluminum, copper, titanium, and/or tantalum), conductive metal nitride (e.g., titanium nitride, tantalum nitride, and/or tungsten nitride), metal-semiconductor compound (e.g., metal silicide), or any combination thereof.

According to some example embodiments of the present inventive concepts, the fine magnetic patterns 210 may be provided between the second magnetic pattern MP2 and the non-magnetic pattern 302 such that a magnetic memory device may be fabricated and/or configured to have increased thermal stability and tunnel magnetic resistance of the magnetic tunnel junction (MTJ) structure. The magnetic memory device may also be configured to have high interface perpendicular magnetic anisotropy (iPMA) between the second magnetic pattern MP2 and the non-magnetic pattern 300.

Figure 6:
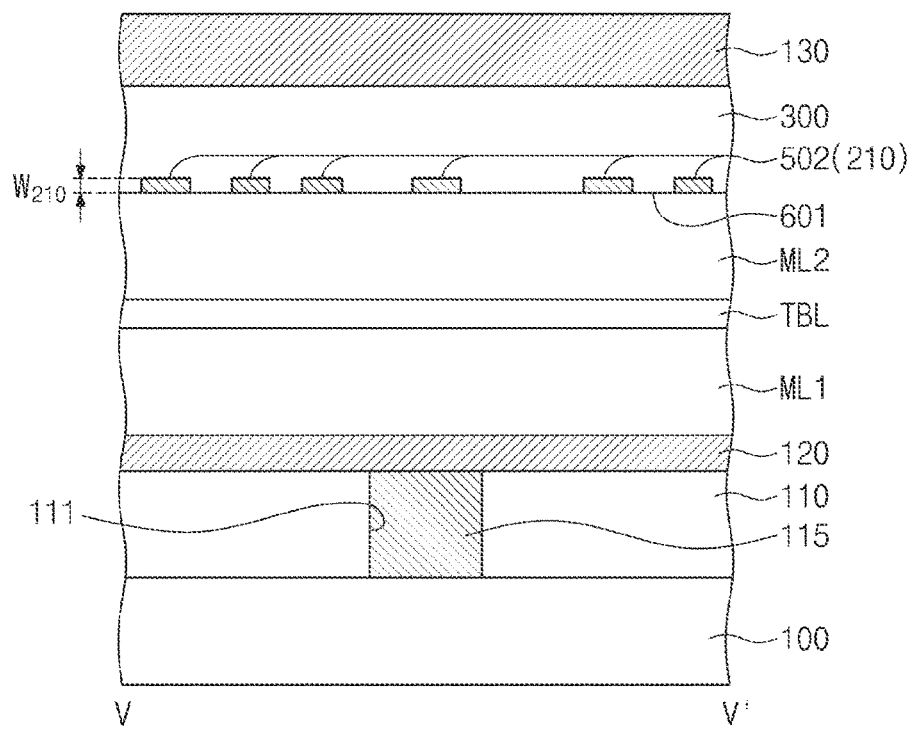
FIGS. 6 and 7 are cross-sectional views taken along line V-V' of FIG. 4, illustrating a method of manufacturing a magnetic memory device according to some example embodiments of the present inventive concepts.
Figure 7:
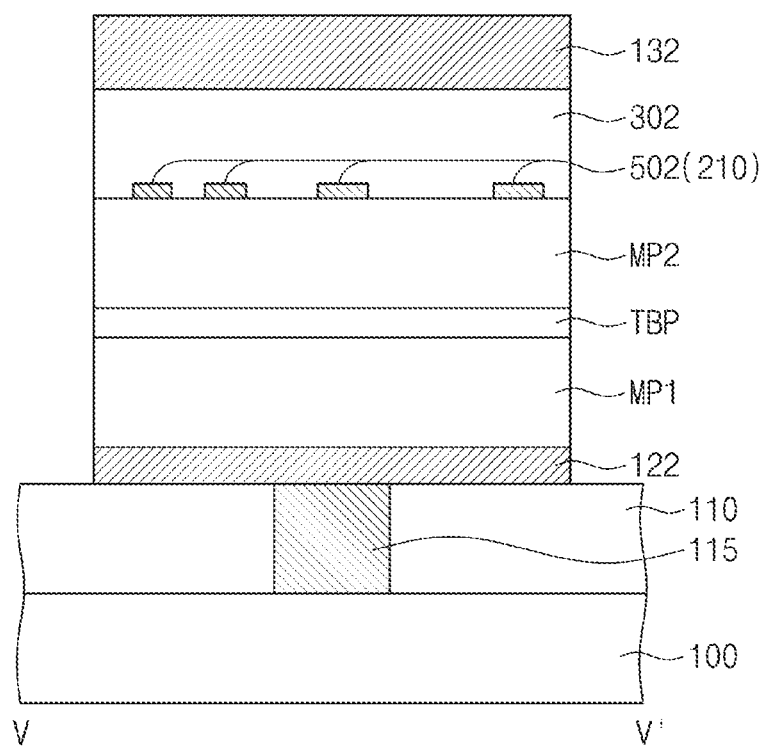

FIGS. 6 and 7 are cross-sectional views taken along line V-V' of FIG. 4, illustrating a method of manufacturing a magnetic memory device according to some example embodiments of the present inventive concepts. Configurations substantially the same (e.g., the same within manufacturing tolerances and/or material tolerances) as those discussed with reference to FIGS. 4 and 5 may be omitted for brevity of the description.

Referring to FIGS. 4 and 6, a substrate 100 may be provided. The substrate 100 may include a semiconductor material. For example, the substrate 100 may include a silicon substrate, a germanium substrate, or a silicon-germanium substrate. A select element (not shown) may be provided on the substrate 100. The select element may be substantially the same as that discussed with reference to FIGS. 4 and 5.

A first interlayer dielectric layer 110 may be formed on the substrate 100, and the select element may be covered with the first interlayer dielectric layer 110. The first interlayer dielectric layer 110 may be formed by a deposition process. For example, the first interlayer dielectric layer 110 may be formed by a physical vapor deposition (PVD) process, a chemical vapor deposition (CVD) process, an atomic layer deposition (ALD) process, or any combination thereof. The first interlayer dielectric layer 110 may include silicon oxide, silicon nitride, silicon oxynitride, or any combination thereof.

A first contact plug 115 may be formed in the first interlayer dielectric layer 110. The formation of the first contact plug 115 may include forming a contact hole 111 to penetrate the first interlayer dielectric layer 110, forming a conductive layer to fill the contact hole 111, and performing a planarization process until exposing a top surface of the first interlayer dielectric layer 110. For example, the contact hole may be formed by an anisotropic etching process, which uses an etching mask (not shown) to etch the first interlayer dielectric layer 110. The first contact plug 115 may include a conductive material. For example, the first contact plug 115 may include doped semiconductor material (e.g., doped silicon), metal (e.g., tungsten, aluminum, copper, titanium, and/or tantalum), conductive metal nitride (e.g., titanium nitride, tantalum nitride, and/or tungsten nitride), metal-semiconductor compound (e.g., metal silicide), or any combination thereof.

A first electrode layer 120 may be formed on the first interlayer dielectric layer 110 and the first contact plug 115. The first electrode layer 120 may be formed by a physical vapor deposition (PVD) process, a chemical vapor deposition (CVD) process, an atomic layer deposition (ALD) process, or any combination thereof. The first electrode layer 120 may include conductive metal nitride, metal, or a combination thereof. In some example embodiments, the first electrode layer 120 may include at least one seed layer that is configured to serve as a seed in a process for forming a first magnetic layer ML1 which will be discussed below. For example, when a first magnetic layer ML1 includes a magnetic material having an $L1_0$ structure, the first electrode layer 120 may include conductive metal nitride having a sodium chloride (NaCl) crystal structure (e.g., titanium nitride, tantalum nitride, chromium nitride, or vanadium nitride). In some example embodiments, if and/or when the first magnetic layer ML1 has a hexagonal close-packed crystal structure, the first electrode layer 120 may include a conductive material having a hexagonal close-packed crystal structure (e.g., ruthenium). However, the present inventive concepts are not limited thereto. The first electrode layer 120 may include other conductive materials (e.g., titanium or tantalum).

A first magnetic layer ML1, a tunnel barrier layer TBL, and a second magnetic layer ML2 may be sequentially formed on the first electrode layer 120. The first magnetic layer ML1, the tunnel barrier layer TBL, and the second magnetic layer ML2 may be formed by a deposition process. For example, each of the first magnetic layer ML1, the tunnel barrier layer TBL, and the second magnetic layer ML2 may be formed by a physical vapor deposition (PVD) process, a chemical vapor deposition (CVD) process, an atomic layer deposition (ALD) process, or any combination thereof.

The first magnetic layer ML1 may be a reference magnetic layer. The first magnetic layer ML1 may include at least one of a perpendicular magnetic material, a perpendicular magnetic material having an $L1_0$ structure, a CoPt alloy of a hexagonal close-packed lattice structure, and a perpendicular magnetic structure. The perpendicular magnetic material may include at least one of CoFeTb, CoFeGd, and CoFeDy. The perpendicular magnetic material having an $L1_0$ structure may include at least one of FePt of an $L1_0$ structure, FePd of an $L1_0$ structure, CoPd of the $L1_0$ structure, and CoPt of an $L1_0$ structure. The perpendicular magnetic structure may include magnetic layers and non-magnetic layers that are alternately and repeatedly stacked. For example, the perpendicular magnetic structure may include at least one of a (Co/Pt)n stack structure, a (CoFe/Pt)n stack structure, a (CoFe/Pd)n stack structure, a (Co/Pd)n stack structure, a (Co/Ni)n stack structure, a (CoNi/Pt)n stack structure, a (CoCr/Pt)n stack structure, and a (CoCr/Pd)n stack structure (where, n is the natural number).

The tunnel barrier layer TBL may include at least one of magnesium oxide, titanium oxide, aluminum oxide, magnesium-zinc oxide, and magnesium-boron oxide. In some example embodiments, the tunnel barrier layer TBL may include magnesium oxide having a sodium chloride (NaCl) crystal structure.

The second magnetic layer ML2 may be a free magnetic layer. The second magnetic layer ML2 may include a magnetic element that can combine with oxygen to induce interface perpendicular magnetic anisotropy (iPMA). The second magnetic layer ML2 may further include boron. For example, the second magnetic layer ML2 may be formed of cobalt-iron-boron (CoFeB). In some example embodiments, the second magnetic layer ML2 may be in an amorphous state.

A set 502 of fine magnetic patterns 210 may be formed on the second magnetic layer ML2. The set 502 may include a particular configuration (also referred to herein as a particular "pattern") of fine magnetic patterns 210. The fine magnetic patterns 210 may include a magnetic material. In some example embodiments, the fine magnetic patterns 210 may be formed by a physical vapor deposition (PVD) process, a chemical vapor deposition (CVD) process, an atomic layer deposition (ALD) process, or any combination thereof. Each fine magnetic pattern 210 may include a magnetic material having (e.g., associated with) a lattice constant. The formation of the fine magnetic patterns 210 may be carried out until a thickness W210 of the fine magnetic patterns 210 becomes equal to 2 monolayers (or a bilayer) of atoms of the magnetic material included in the fine magnetic patterns 210 or equal to a lattice constant of the magnetic material included in the fine magnetic patterns 210. The fine magnetic patterns 210 may be horizontally spaced apart from each other. For example, the fine magnetic patterns 210 may be spaced apart from each other in a direction parallel to a top surface of the substrate 100.

A non-magnetic layer 300 may be formed on the second magnetic layer ML2 and the fine magnetic patterns 210. In some example embodiments, the formation of the non-magnetic layer 300 may include forming a metal layer (not shown) to cover at least a portion of the second magnetic layer ML2 and the fine magnetic pattern 210 and oxidizing the metal layer. The metal layer may be formed by a physical vapor deposition (PVD) process, a chemical vapor deposition (CVD) process, an atomic layer deposition (ALD) process, or any combination thereof. The metal layer may include a non-magnetic metal element. For example, the metal layer may include tantalum (Ta), titanium (Ti), magnesium (Mg), hafnium (Hf), zirconium (Zr), tungsten (W), molybdenum (Mo), or any combination thereof. The metal layer may be oxidized to form the non-magnetic layer 300. For example, the metal layer may be oxidized by a natural oxidation process, a reactive oxidation process, or an oxygen (O2) ion beam process. The non-magnetic layer 300 may include non-magnetic metal oxide. For example, the non-magnetic layer 300 may include tantalum oxide, titanium oxide, magnesium oxide, hafnium oxide, zirconium oxide, tungsten oxide, molybdenum oxide, or any combination thereof. In other embodiments, the formation of the non-magnetic layer 300 may include depositing non-magnetic metal oxide directly on the second magnetic layer ML2 and the fine magnetic patterns 210.

A heat treatment process may be carried out. For example, the heat treatment process may be performed during or after the formation of the non-magnetic layer 300. However, the performing time of the heat treatment process is not limited to the disclosed above. In some example embodiments, the heat treatment process may be performed after forming a second electrode layer 130 which will be discussed below. In some example embodiments, the heat treatment process may be carried out employing an annealing process using a furnace, a rapid thermal annealing process, or a laser annealing process. During the heat treatment process, oxygen atoms included in the non-magnetic layer 300 may diffuse into an interface 601 between the second magnetic layer ML2 and the non-magnetic layer 300. The oxygen atoms diffused into the interface 601 between the second magnetic layer ML2 and the non-magnetic layer 300 may combine with atoms of the magnetic material included in the second magnetic layer ML2, thereby inducing interface perpendicular magnetic anisotropy. During the heat treatment process, oxygen atoms included in the non-magnetic layer 300 may diffuse into the fine magnetic patterns 210. The oxygen atoms diffused into the fine magnetic patterns 210 may combine with atoms of the magnetic material included in the fine magnetic patterns 210, thereby inducing perpendicular magnetic anisotropy.

A second electrode layer 130 may be formed on the non-magnetic layer 300. The second electrode layer 130 may be formed using at least one of a physical vapor deposition (PVD) process, a chemical vapor deposition (CVD) process, and an atomic layer deposition (ALD) process. The second electrode layer 130 may include metal (e.g., tungsten, aluminum, copper, titanium, ruthenium, and/or tantalum), conductive metal nitride (e.g., titanium nitride, tantalum nitride, and/or tungsten nitride), or any combination thereof.

Referring to FIG. 7, an etching process using an etching mask (not shown) may be performed to sequentially etch the second electrode layer 130, the non-magnetic layer 300, the second magnetic layer ML2, the tunnel barrier layer TBL, the first magnetic layer ML1, and the first electrode layer 120. In some example embodiments, the etching process may be carried out using an ion beam etching process. The second electrode layer 130, the non-magnetic layer 300, the second magnetic layer ML2, the tunnel barrier layer TBL, the first magnetic layer ML1, and the first electrode layer 120 may be sequentially etched to form a second electrode pattern 132, a non-magnetic pattern 302, a second magnetic pattern MP2, a tunnel barrier pattern TBP, a first magnetic pattern MP1, and a first electrode pattern 122, respectively. A magnetic tunnel junction (MTJ) pattern may be defined to include the first magnetic pattern MP1, the second magnetic pattern MP2, and the tunnel barrier pattern TBP therebetween. The first electrode pattern 122 may be electrically connected to the first contact plug 115 formed in the first interlayer dielectric layer 110. The magnetic tunnel junction (MTJ) pattern may be formed between the first and second electrode patterns 122 and 132.

Referring back to FIG. 5, a second interlayer dielectric layer 140 may be formed on the first interlayer dielectric layer 110 to cover the first electrode pattern 122, the first magnetic pattern MP1, the tunnel barrier pattern TBP, the second magnetic pattern MP2, and the second electrode pattern 132. The second interlayer dielectric layer 140 may be formed by a deposition process. For example, the second interlayer dielectric layer 140 may be formed by a physical vapor deposition (PVD) process, a chemical vapor deposition (CVD) process, an atomic layer deposition (ALD) process, or any combination thereof. The second interlayer dielectric layer 140 may include silicon oxide, silicon nitride, silicon oxynitride, or any combination thereof.

A second contact plug 145 may be formed in the second interlayer dielectric layer 140. The second contact plug 145 may penetrate the second interlayer dielectric layer 140 to be electrically connected to the second electrode pattern 132. The formation of the second contact plug 145 may include forming a contact hole (not shown) to penetrate the second interlayer dielectric layer 140, forming a conductive layer to fill the contact hole, and performing a planarization process until exposing a top surface of the second interlayer dielectric layer 140. For example, the contact hole may be formed by an anisotropic etching process, which uses an etching mask (not shown) to etch the second interlayer dielectric layer 140. The second contact plug 145 may include a conductive material. For example, the second contact plug 145 may include doped semiconductor material (e.g., doped silicon), metal (e.g., tungsten, aluminum, copper, titanium, and/or tantalum), conductive metal nitride (e.g., titanium nitride, tantalum nitride, and/or tungsten nitride), metal-semiconductor compound (e.g., metal silicide), or any combination thereof.

An interconnect line 150 may be formed on the second interlayer dielectric layer 140. The interconnect line 150 may be electrically connected to the second contact plug 145. The interconnect line 150 may include doped semiconductor material (e.g., doped silicon), metal (e.g., tungsten, aluminum, copper, titanium, and/or tantalum), conductive metal nitride (e.g., titanium nitride, tantalum nitride, and/or tungsten nitride), metal-semiconductor compound (e.g., metal silicide), or any combination thereof. In some example embodiments, the interconnect line 150 may be a bit line.

Figure 8:
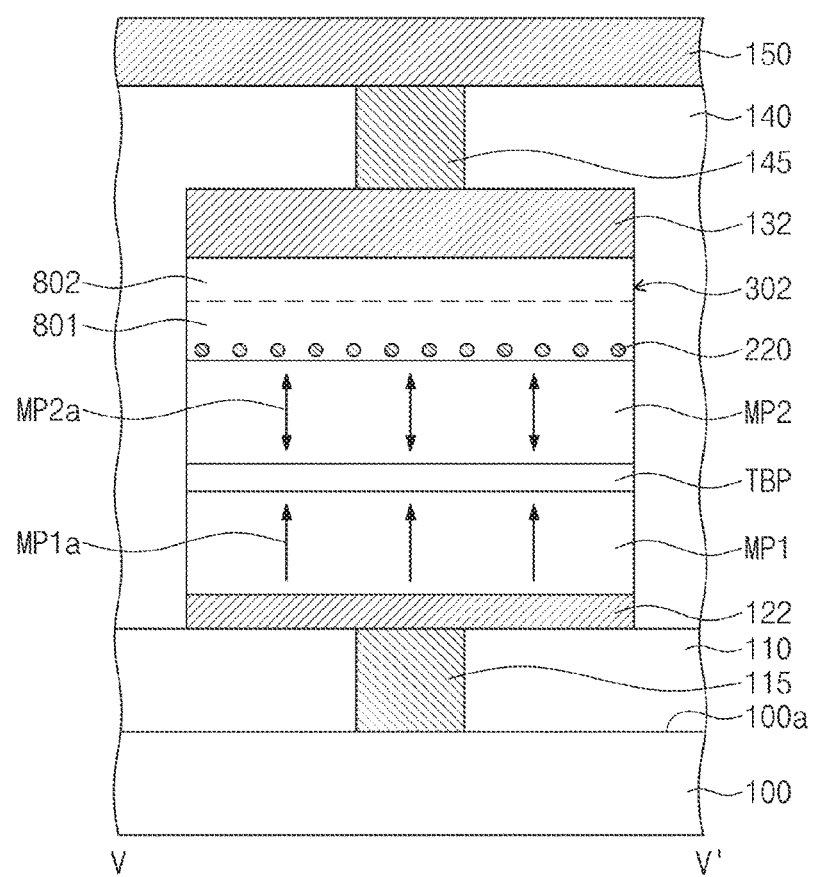
FIG. 8 is a cross-sectional view corresponding to line V-V' of FIG. 4, illustrating a magnetic tunnel junction (MTJ) structure according to some example embodiments of the present inventive concepts.

FIG. 8 is a cross-sectional view corresponding to line V-V' of FIG. 4, illustrating a magnetic tunnel junction (MTJ) structure according to some example embodiments of the present inventive concepts. Configurations substantially the same as those discussed with reference to FIGS. 4 and 5 may be omitted for brevity of the description.

Referring to FIGS. 4 and 8, a substrate 100 may be provided thereon with a first interlayer dielectric layer 110, a first contact plug 115, a first electrode pattern 122, a first magnetic pattern MP1, a tunnel barrier pattern TBP, a second magnetic pattern MP2, a second electrode pattern 132, a second interlayer dielectric layer 140, a second contact plug 145, and an interconnect line 150. The substrate 100, the first interlayer dielectric layer 110, the first contact plug 115, the first electrode pattern 122, the first magnetic pattern MP1, the tunnel barrier pattern TBP, the second magnetic pattern MP2, the second electrode pattern 132, the second interlayer dielectric layer 140, the second contact plug 145, and the interconnect line 150 may be substantially the same as those discussed with reference to FIGS. 4 and 5.

A non-magnetic pattern 302 may be provided between the second magnetic pattern MP2 and the second electrode pattern 132. For example, the non-magnetic pattern 302 may have a bottom surface, which is in contact with a top surface of the second magnetic pattern MP2, and a top surface, which is in contact with a bottom surface of the second electrode pattern 132. The non-magnetic pattern 302 may include a non-magnetic material. For example, the non-magnetic pattern 302 may include non-magnetic metal oxide. For example, the non-magnetic pattern 302 may include tantalum oxide, titanium oxide, magnesium oxide, hafnium oxide, zirconium oxide, tungsten oxide, molybdenum oxide, or any combination thereof.

The non-magnetic pattern 302 on the second magnetic pattern MP2 may be at least partially doped with magnetic atoms 220. For example, the non-magnetic pattern 302 may have a proximate portion 801 that is adjacent to (e.g., directly on) and/or proximate to the second magnetic pattern MP2 and doped with the magnetic atoms 220 and a distal portion 802 that is distal from the second magnetic pattern MP2, relative to the proximate portion 801, and is not doped with the magnetic atoms 220. For example, the magnetic atoms 220 may be doped to have a doping thickness, which extends from a bottom surface of the non-magnetic pattern 302 along a direction perpendicular to a top surface 100a of the substrate 100, less than 2 monolayers (or a bilayer) or a lattice constant of (e.g., lattice constant associated with) the magnetic atoms 220. The aforementioned example is, however, merely illustrative so that the doping thickness of the magnetic atoms 220 is not limited to the disclosed above. In some example embodiments, the magnetic atoms 220 may have a concentration that is equal to or less than about 20 at %.

The magnetic atoms 220 may have a magnetic moment perpendicular to the top surface of the substrate 100. The magnetic moment of the magnetic atoms 220 may reinforce a magnetic moment of an area between the second magnetic pattern MP2 and a non-magnetic pattern 302. The non-magnetic pattern 302 that is at least partially doped with magnetic atoms 220 may thus be configured to reinforce magnetic polarization and interface perpendicular magnetic anisotropy (iPMA) between the second magnetic pattern MP2 and the non-magnetic pattern 302. The non-magnetic pattern 302 that is at least partially doped with magnetic atoms 220 may further be configured to increase thermal stability and tunnel magnetic resistance of magnetic tunnel junction (MTJ) structure.

In some example embodiments, a magnetic tunnel junction pattern may include both a set 502 of fine magnetic patterns 210 and a non-magnetic pattern 302 that is at least partially doped with magnetic atoms 220 (e.g., in proximate portion 801 of the non-magnetic pattern).

Figure 9:
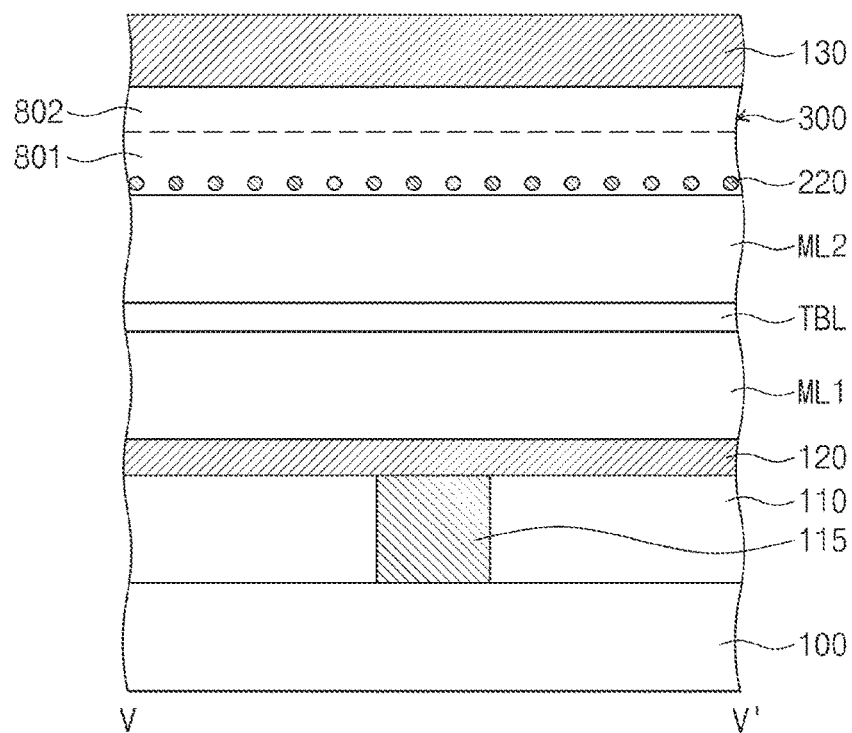
FIGS. 9 and 10 are cross-sectional views illustrating a method of manufacturing a magnetic tunnel junction (MTJ) structure according to some example embodiments of the present inventive concepts.
Figure 10:
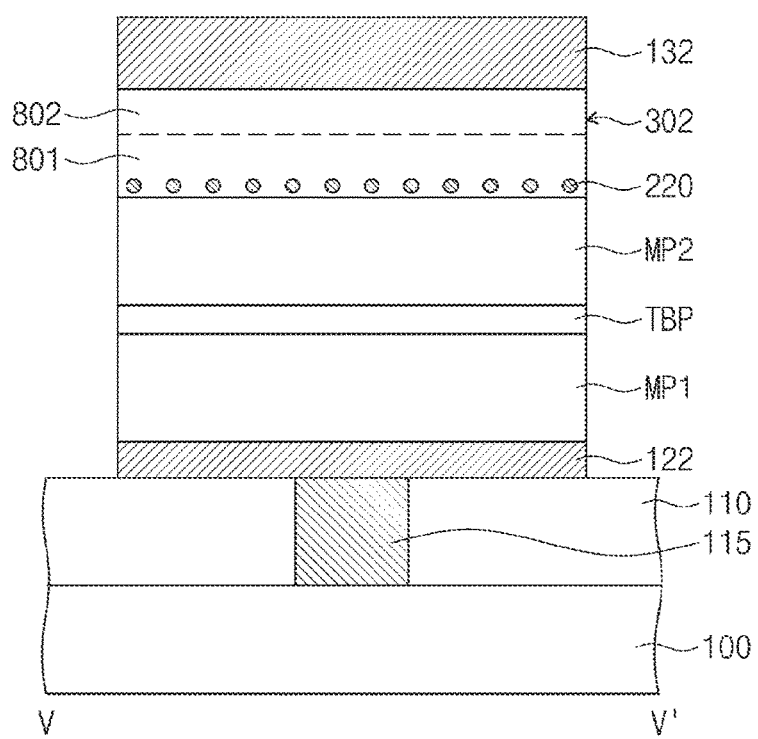

FIGS. 9 and 10 are cross-sectional views illustrating a method of manufacturing a magnetic tunnel junction (MTJ) structure according to some example embodiments of the present inventive concepts. Configurations substantially the same as those discussed with reference to FIGS. 6 and 7 may be omitted for brevity of the description.

Referring to FIG. 9, a substrate 100 may be provided thereon with a first interlayer dielectric layer 110, a first contact plug 115, a first electrode layer 120, a first magnetic layer ML1, a tunnel barrier layer TBL, a second magnetic layer ML2, a non-magnetic layer 300, and a second electrode layer 130. The substrate 100, the first interlayer dielectric layer 110, the first contact plug 115, the first electrode layer 120, the first magnetic layer ML1, the tunnel barrier layer TBL, the second magnetic layer ML2, the non-magnetic layer 300, and the second electrode layer 130 may be formed using processes substantially the same as those discussed with reference to FIG. 6. As fine magnetic patterns 210 are not provided, the non-magnetic layer 300 may be formed directly on the second magnetic layer ML2.

During the formation of the non-magnetic layer 300, magnetic atoms 220 may be provided to dope at least a proximate portion 801 of the non-magnetic layer 300. When the non-magnetic layer 300 is formed by depositing and oxidizing a metal layer (not shown), the magnetic atoms 220 may be provided during the deposition of the metal layer. For example, a proximate portion 801 of the metal layer may be doped with the magnetic atoms 220 that are provided at an earlier time when the metal layer is deposited. For example, the magnetic atoms 220 may be doped to have a doping thickness, which extends from a bottom surface of the metal layer along a direction perpendicular to a top surface of the substrate 100, less than 2 monolayers (or a bilayer) or a lattice constant of the magnetic atoms 220. The aforementioned example is, however, merely illustrative so that the doping thickness of the magnetic atoms 220 is not limited to the disclosed above. In some example embodiments, the formation of the non-magnetic layer 300 may include depositing a metal oxide layer directly on the second magnetic layer ML2. In this case, the magnetic atoms 220 may be provided during the deposition of the metal oxide layer. For example, a proximate portion of the metal oxide layer (e.g., a portion that is adjacent to (e.g., directly on) and/or proximate to the second magnetic layer ML2) may be doped with the magnetic atoms 220 that are provided at an earlier time when the metal oxide layer is deposited. For example, the magnetic atoms 220 may be doped to have a doping thickness, which extends from a bottom surface of the metal oxide layer along a direction perpendicular to a top surface of the substrate 100, less than 2 monolayers (or a bilayer) or a lattice constant of the magnetic atoms 220. The aforementioned example is, however, merely illustrative so that the doping thickness of the magnetic atoms 220 is not limited to the disclosed above. In some example embodiments, the magnetic atoms 220 may have a concentration of about 20 at % or less.

Referring to FIG. 10, the second electrode layer 130, the non-magnetic layer 300, the second magnetic layer ML2, the tunnel barrier layer TBL, the first magnetic layer ML1, and the first electrode layer 120 may be sequentially etched to form a second electrode pattern 132, a non-magnetic pattern 302, a second magnetic pattern MP2, a tunnel barrier pattern TBP, a first magnetic pattern MP1, and a first electrode pattern 122, respectively. The second electrode pattern 132, the non-magnetic pattern 302, the second magnetic pattern MP2, the tunnel barrier pattern TBP, the first magnetic pattern MP1, and the first electrode pattern 122 may be formed using processes substantially the same as those discussed with reference to FIG. 6. A magnetic tunnel junction (MTJ) pattern may be defined to include the first magnetic pattern MP1, the second magnetic pattern MP2, and the tunnel barrier pattern TBP therebetween.

Referring back to FIG. 8, a second interlayer dielectric layer 140, a second contact plug 145, and an interconnect line 150 may be formed. The second interlayer dielectric layer 140, the second contact plug 145, and the interconnect line 150 may be formed using processes substantially the same as those discussed with reference back to FIG. 5.

Figure 11:
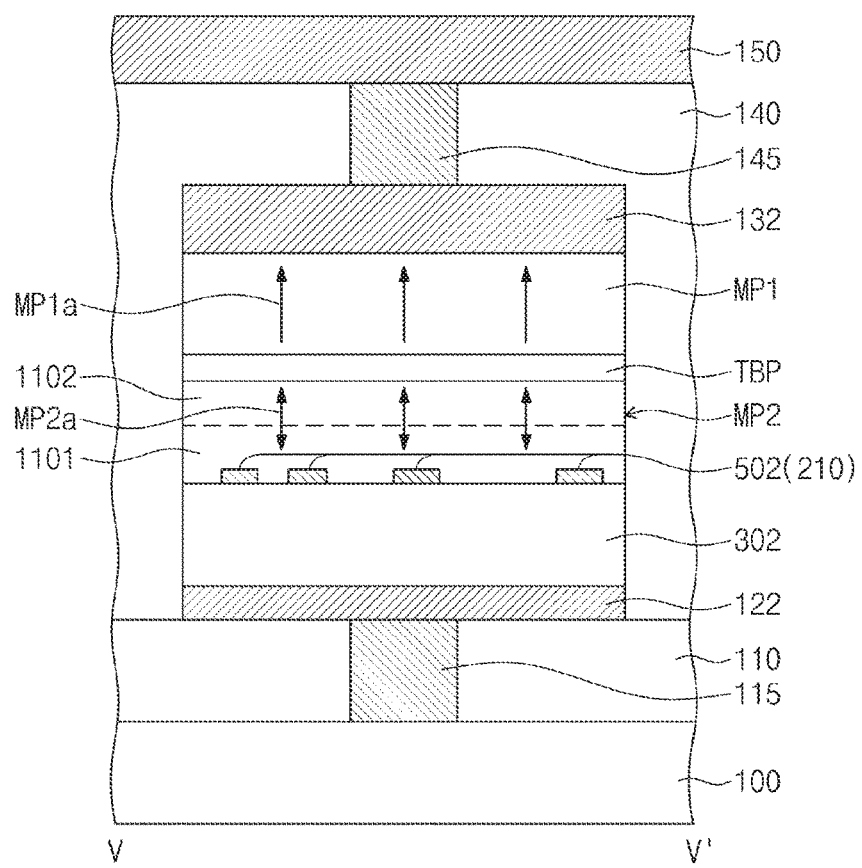
FIG. 11 is a cross-sectional view corresponding to line V-V' of FIG. 4, illustrating a magnetic tunnel junction (MTJ) structure according to some example embodiments of the present inventive concepts.

FIG. 11 is a cross-sectional view corresponding to line V-V' of FIG. 4 illustrating a magnetic tunnel junction (MTJ) structure according to some example embodiments of the present inventive concepts. Configurations substantially the same as those discussed with reference to FIGS. 4 to 7 may be omitted for brevity of the description.

Referring to FIGS. 4 and 11, a substrate 100 may be provided thereon with a first interlayer dielectric layer 110, a first contact plug 115, a first electrode pattern 122, a second electrode pattern 132, a second interlayer dielectric layer 140, a second contact plug 145, and an interconnect line 150. The substrate 100, the first interlayer dielectric layer 110, the first contact plug 115, the first electrode pattern 122, the second electrode pattern 132, the second interlayer dielectric layer 140, the second contact plug 145, and the interconnect line 150 may be substantially the same as those discussed with reference to FIGS. 4 and 5. The substrate 100, the first interlayer dielectric layer 110, the first contact plug 115, the first electrode pattern 122, the second electrode pattern 132, the second interlayer dielectric layer 140, the second contact plug 145, and the interconnect line 150 may be formed using processes substantially the same as those discussed with reference to FIGS. 6 and 7.

Differently from that shown in FIG. 5, a non-magnetic pattern 302, a second magnetic pattern MP2, a tunnel barrier pattern TBP, and a first magnetic pattern MP1 may be sequentially provided between the first and second electrode patterns 122 and 132. The second magnetic pattern MP2 may have a changeable magnetization direction MP2a, and the first magnetic pattern MP1 may have a fixed magnetization direction MP1a. The non-magnetic pattern 302, the second magnetic pattern MP2, the tunnel barrier pattern TBP, and the first magnetic pattern MP1 may be substantially the same as those discussed with reference to FIG. 5. The non-magnetic pattern 302, the second magnetic pattern MP2, the tunnel barrier pattern TBP, and the first magnetic pattern MP1 may be formed using processes substantially the same as those discussed with reference to FIGS. 6 and 7. However, differently from that discussed with reference to FIG. 6, a non-magnetic layer (see 300 of FIG. 6), a second magnetic layer (see ML2 of FIG. 6), a tunnel barrier layer (see TBL of FIG. 6), and a first magnetic layer (see ML1 of FIG. 6) may be sequentially deposited.

Figure 12:
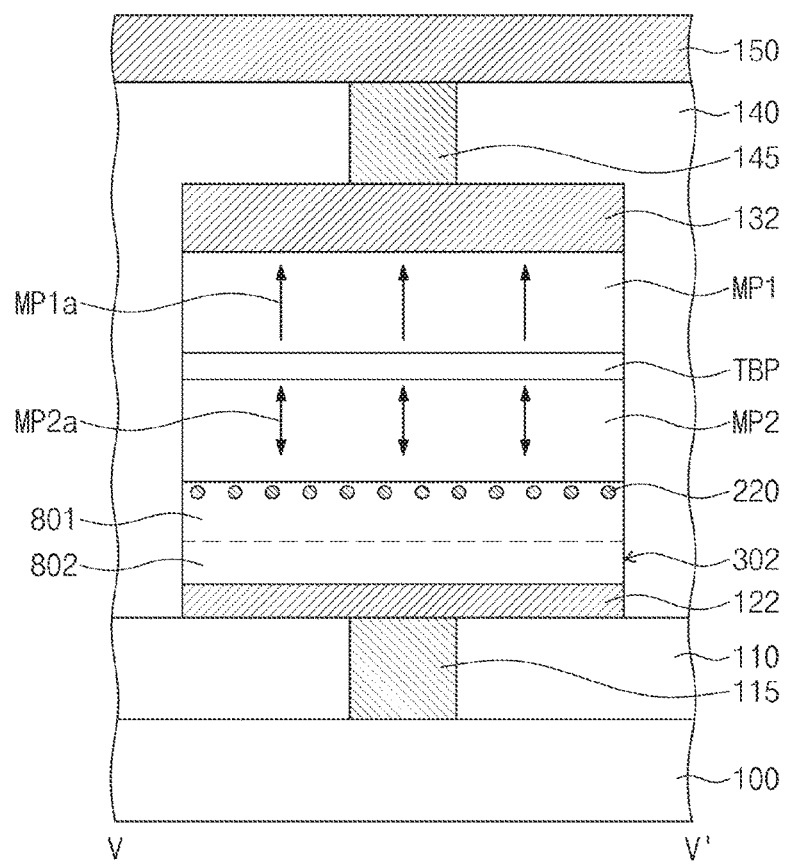
FIG. 12 is a cross-sectional view corresponding to line V-V' of FIG. 4, illustrating a magnetic tunnel junction (MTJ) structure according to some example embodiments of the present inventive concepts.

A set 502 of fine magnetic patterns 210 may be interposed between the non-magnetic pattern 302 and the second magnetic pattern MP2. The set 502 of fine magnetic patterns 210 may be substantially the same as the set 502 discussed with reference to FIG. 5, except for a relative position of the fine magnetic patterns 210 to the non-magnetic pattern 302 and the second magnetic pattern MP2. The fine magnetic patterns 210 may be provided on the non-magnetic pattern 302. For example, the fine magnetic patterns 210 may have a bottom surface coplanar to a top surface of the non-magnetic pattern 302. The fine magnetic patterns 210 may be included in a proximate portion 1101 of the second magnetic pattern MP2 that, as shown in FIG. 12, may be adjacent to (e.g., directly on) and/or proximate to the non-magnetic pattern 302. The proximate portion 1101 of the second magnetic pattern MP2 may be distinguished from a distal portion 1102 of the second magnetic pattern MP2 that is distal from the non-magnetic pattern 302 and may be adjacent to (e.g., directly on) and/or proximate to the tunnel barrier pattern TBP. For example, the fine magnetic patterns 210 may have top and side surfaces covered with the second magnetic pattern MP2. Differently from that discussed with reference to FIG. 6, the set 502 of fine magnetic patterns 210 may be formed after the non-magnetic layer (see 300 of FIG. 6) is formed. Thus, the fine magnetic patterns 210 may be formed on a top surface of the non-magnetic layer (see 300 of FIG. 6).

The fine magnetic patterns 210 may have a magnetic moment perpendicular to a top surface of the substrate 100. The magnetic moment of the fine magnetic patterns 210 may reinforce a magnetic moment of an area between the second magnetic pattern MP2 and a non-magnetic pattern 302. It thus may be possible to reinforce magnetic polarization and interface perpendicular magnetic anisotropy (iPMA) between the second magnetic pattern MP2 and the non-magnetic pattern 302, and also to increase thermal stability and tunnel magnetic resistance of a magnetic tunnel junction (MTJ) structure.

FIG. 12 is a cross-sectional view corresponding to line V-V' of FIG. 4 illustrating a magnetic tunnel junction (MTJ) structure according to some example embodiments of the present inventive concepts. Configurations substantially the same as those discussed with reference to FIGS. 8 to 10 may be omitted for brevity of the description.

Referring to FIGS. 4 and 12, a substrate 100 may be provided thereon with a first interlayer dielectric layer 110, a first contact plug 115, a first electrode pattern 122, a second electrode pattern 132, a second interlayer dielectric layer 140, a second contact plug 145, and an interconnect line 150. The substrate 100, the first interlayer dielectric layer 110, the first contact plug 115, the first electrode pattern 122, the second electrode pattern 132, the second interlayer dielectric layer 140, the second contact plug 145, and the interconnect line 150 may be substantially the same as those discussed with reference to FIGS. 4 and 5. The substrate 100, the first interlayer dielectric layer 110, the first contact plug 115, the first electrode pattern 122, the second electrode pattern 132, the second interlayer dielectric layer 140, the second contact plug 145, and the interconnect line 150 may be formed using processes substantially the same as those discussed with reference to FIG. 8.

Differently from that shown in FIG. 8, a non-magnetic pattern 302, a second magnetic pattern MP2, a tunnel barrier pattern TBP, and a first magnetic pattern MP1 may be sequentially provided between the first and second electrode patterns 122 and 132. The second magnetic pattern MP2 may have a changeable magnetization direction MP2a, and the first magnetic pattern MP1 may have a fixed magnetization direction MP1a. The non-magnetic pattern 302, the second magnetic pattern MP2, the tunnel barrier pattern TBP, and the first magnetic pattern MP1 may be substantially the same as those discussed with reference to FIG. 8. The non-magnetic pattern 302, the second magnetic pattern MP2, the tunnel barrier pattern TBP, and the first magnetic pattern MP1 may be formed using processes substantially the same as those discussed with reference to FIGS. 9 and 10. However, differently from that discussed with reference to FIG. 9, a non-magnetic layer (see 300 of FIG. 9), a second magnetic layer (see ML2 of FIG. 9), a tunnel barrier layer (see TBL of FIG. 9), and a first magnetic layer (see ML1 of FIG. 9) may be sequentially deposited.

The non-magnetic pattern 302 may be doped with magnetic atoms 220. For example, the non-magnetic pattern 302 may have a proximate portion 801 that is adjacent to (e.g., directly on) and/or proximate to the magnetic pattern MP2 and doped with the magnetic atoms 220. In some example embodiments, the magnetic atoms 220 may have a concentration equal to or less than about 20 at %. The magnetic atoms 220 may dope at least the proximate portion 801 of the non-magnetic pattern 302 using a process substantially the same as that discussed with reference to FIG. 9, except for a position of the magnetic atoms 220. When the non-magnetic layer (see 300 of FIG. 9) is formed by depositing and oxidizing a metal layer (not shown), the magnetic atoms 220 may be provided at a later time when the metal layer is deposited. Thus, the proximate portion 801 may be an upper portion of the metal layer that may be doped with the magnetic atoms 220. The magnetic atoms 220 may be doped to have a doping thickness, which extends from a top surface of the metal layer along in a direction perpendicular to a top surface of the substrate 100, less than 2 monolayers (or a bilayer) or a lattice constant of the magnetic atoms 220. The aforementioned example is, however, merely illustrative so that the doping thickness of the magnetic atoms 220 is not limited to the disclosed above. In some example embodiments, the formation of the non-magnetic layer (see 300 of FIG. 9) may include depositing a metal oxide layer directly on the second magnetic layer (see ML2 of FIG. 9). In this case, the magnetic atoms 220 may be provided during the deposition of the metal oxide layer. For example, a proximate portion of the metal oxide layer may be doped with the magnetic atoms 220 that are provided at a later time when the metal oxide layer is deposited. The magnetic atoms 220 may be doped to have a doping thickness, which extends from a top surface of the metal oxide layer along a direction perpendicular to a top surface of the substrate 100, less than 2 monolayers (or a bilayer) or a lattice constant of the magnetic atoms 220. The aforementioned example is, however, merely illustrative so that the doping thickness of the magnetic atoms 220 is not limited to the disclosed above.

The magnetic atoms 220 may have a magnetic moment perpendicular to the top surface of the substrate 100. The magnetic moment of the magnetic atoms 220 may reinforce a magnetic moment of an area between the second magnetic pattern MP2 and a non-magnetic pattern 302. It thus may be possible to reinforce magnetic polarization and interface perpendicular magnetic anisotropy (iPMA) between the second magnetic pattern MP2 and the non-magnetic pattern 302, and also to increase thermal stability and tunnel magnetic resistance of a magnetic tunnel junction (MTJ) structure.

According to some example embodiments of the present inventive concepts, the magnetic tunnel junction may include the magnetic layer, the non-magnetic layer adjacent to the magnetic layer, and the fine magnetic patterns interposed between the magnetic and non-magnetic layers. The fine magnetic patterns may have a magnetic moment perpendicular to the top surface of the substrate. The magnetic moment of the fine magnetic patterns may reinforce a magnetic moment of an area between the nom-magnetic pattern and the second magnetic pattern. It therefore may be possible to improve interface perpendicular magnetic anisotropy (iPMA) between the non-magnetic pattern and the second magnetic pattern, and thermal stability and tunnel magnetic resistance of the magnetic tunnel junction (MTJ) structure.

The aforementioned description provides some example embodiments for explaining the present inventive concepts. Therefore, the present inventive concepts is not limited to the embodiments described above, and it will be understood by one of ordinary skill in the art that variations in form and detail may be made therein without departing from the spirit and essential features of the inventive concepts.

What is claimed is:

1. A magnetic memory device, comprising:
a substrate; and
a plurality of magnetic tunnel junction patterns on the substrate, each magnetic tunnel junction pattern of the plurality of magnetic tunnel junction patterns including,
a first magnetic pattern and a second magnetic pattern stacked in a direction perpendicular to a top surface of the substrate;
a tunnel barrier pattern between the first magnetic pattern and the second magnetic pattern;
a non-magnetic pattern on the second magnetic pattern in the direction perpendicular to the top surface of the substrate, such that the second magnetic pattern is between the non-magnetic pattern and the tunnel barrier pattern; and
a set of fine magnetic patterns between the second magnetic pattern and the non-magnetic pattern, the set of fine magnetic patterns including a pattern of fine magnetic patterns spaced apart from each other in a direction parallel to the top surface of the substrate.

2. The magnetic memory device of claim 1, wherein, each fine magnetic pattern of the set of fine magnetic patterns includes a magnetic material, the magnetic material associated with a lattice constant, and each fine magnetic pattern has a thickness that is less than the lattice constant of the magnetic material.

3. The magnetic memory device of claim 1, wherein each fine magnetic pattern has a magnetization direction perpendicular to the top surface of the substrate.

4. The magnetic memory device of claim 1, wherein the set of fine magnetic patterns is on the second magnetic pattern.

5. The magnetic memory device of claim 4, wherein the non-magnetic pattern is between adjacent fine magnetic patterns.

6. The magnetic memory device of claim 4, wherein the non-magnetic pattern covers top and side surfaces of the fine magnetic patterns.

7. The magnetic memory device of claim 1, wherein the set of fine magnetic patterns is on the non-magnetic pattern.

8. The magnetic memory device of claim 7, wherein the second magnetic pattern covers top and side surfaces of the fine magnetic patterns.

9. The magnetic memory device of claim 1, wherein the non-magnetic pattern includes at least one of tantalum (Ta), titanium (Ti), and magnesium (Mg).

10. A magnetic memory device, comprising:
a substrate; and
a plurality of magnetic tunnel junction patterns on the substrate, each magnetic tunnel junction pattern of the plurality of magnetic tunnel junction patterns including,
a first magnetic pattern and a second magnetic pattern stacked in a direction perpendicular to a top surface of the substrate;
a tunnel barrier pattern between the first magnetic pattern and the second magnetic pattern; and
a non-magnetic pattern on the second magnetic pattern in the direction perpendicular to the top surface of the substrate, such that the second magnetic pattern is between the non-magnetic pattern and the tunnel barrier pattern, at least a portion of the non-magnetic pattern doped with magnetic atoms.

11. The magnetic memory device of claim 10, wherein, the first magnetic pattern is between the substrate and the tunnel barrier pattern,
the non-magnetic pattern includes a proximate portion that is adjacent to a top surface of the second magnetic pattern, and
the proximate portion is doped with the magnetic atoms.

12. The magnetic memory device of claim 11, wherein, the magnetic atoms have a doping thickness that is less than a lattice constant associated with the magnetic atoms, and
the doping thickness extends from a bottom surface of the non-magnetic pattern along the direction perpendicular to the top surface of the substrate.

13. The magnetic memory device of claim 10, wherein,
the second magnetic pattern is between the substrate and the tunnel barrier pattern,
the non-magnetic pattern includes a proximate portion that is adjacent to a bottom surface of the second magnetic pattern, and
the proximate portion is doped with the magnetic atoms.

14. The magnetic memory device of claim 13, wherein,
the magnetic atoms have a doping thickness less than a lattice constant associated with the magnetic atoms, and
the doping thickness extends from a top surface of the non-magnetic pattern along the direction perpendicular to the top surface of the substrate.

15. The magnetic memory device of claim 10, wherein the magnetic atoms have a magnetization direction that is perpendicular to the top surface of the substrate.

16. A magnetic memory device, comprising:
a first magnetic pattern;
a second magnetic pattern on the first magnetic pattern;
a tunnel barrier pattern between the first magnetic pattern and the second magnetic pattern;
a non-magnetic pattern on the second magnetic pattern; and
a magnetic material between at least a distal portion of the non-magnetic pattern and the second magnetic pattern.

17. The magnetic memory device of claim 16, wherein,
the magnetic material is associated with a lattice constant, and
the magnetic material is included in a structure having a thickness that is less than the lattice constant of the magnetic material.

18. The magnetic memory device of claim 16, wherein,
the magnetic material includes a set of fine magnetic patterns between the second magnetic pattern and the non-magnetic pattern, the set of fine magnetic patterns including a pattern of fine magnetic patterns spaced apart from each other in a direction parallel to an interface between the second magnetic pattern and the non-magnetic pattern.

19. The magnetic memory device of claim 18, wherein,
the set of fine magnetic patterns is on the second magnetic pattern.

20. The magnetic memory device of claim 16, wherein,
the magnetic material includes magnetic atoms, and
the non-magnetic pattern includes a proximate portion that is proximate to the second magnetic pattern, the proximate portion doped with the magnetic atoms.

\* \* \* \* \*